United States Patent
Asabe (10) Patent No.: US 7,633,082 B2
(45) Date of Patent: Dec. 15, 2009

(54) LIGHT EMITTING DEVICE

(75) Inventor: Yoshiyuki Asabe, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 454 days.

(21) Appl. No.: 11/565,428

(22) Filed: Nov. 30, 2006

(65) Prior Publication Data

US 2007/0120119 A1    May 31, 2007

(30) Foreign Application Priority Data

Nov. 30, 2005    (JP) ............................. 2005-345041

(51) Int. Cl.
*H01L 29/08*    (2006.01)
(52) U.S. Cl. .................... 257/13; 257/40; 257/E29.1; 257/E27.06
(58) Field of Classification Search .................. 257/13, 257/40, 72, 642, 643, 759
See application file for complete search history.

(56) References Cited

U.S. PATENT DOCUMENTS 6,465,082 B1 * 10/2002 Takezawa et al. ........... 428/209
7,215,075 B2 * 5/2007 Kurata ........................ 313/506

FOREIGN PATENT DOCUMENTS

| JP | 11-273859 | 10/1999 |
| JP | 2001-068264 | 3/2001 |

* cited by examiner

*Primary Examiner*—Roy K Potter
(74) *Attorney, Agent, or Firm*—Brinks Hofer Gilson & Lione (57) ABSTRACT

A light emitting device includes a laminate of a lower electrode layer, an organic light-emitting layer, and an upper transparent electrode layer. In the light emitting device, an auxiliary electrode layer is formed of colloidal nano-sized particles of a conductive metal between the lower electrode layer and the organic light-emitting layer. The auxiliary electrode layer causes the lower electrode layer to be flat and the light emitting efficient to be improved. A light emitting device having a structure in which a transparent electrode layer is formed as the lower electrode layer, and an organic light-emitting layer, an auxiliary electrode layer, and an upper electrode layer are sequentially formed thereon has the same effects. When glass is produced by a sol-gel method using metal alkoxide and the light emitting device is sealed by the glass, it is possible to extend the light emitting period.

18 Claims, 1 Drawing Sheet

LIGHT EMITTING DEVICE

BACKGROUND OF THE INVENTION

1. Field of the Invention

The present invention relates to a light emitting device using an organic light-emitting layer, and more specifically, a light emitting device that includes: a lower electrode layer disposed inside a light-emitting region surrounded by a bank (sealing wall); an organic light-emitting layer provided on the lower electrode layer; and a transparent electrode layer provided on the organic light-emitting layer. Also, the present invention relates to a light emitting device that includes: a transparent electrode layer disposed inside a light-emitting region; an organic light-emitting layer provided on the transparent electrode layer; and a counter electrode layer provided on the organic light-emitting layer.

2. Description of the Related Art

The basic structure of a light emitting device using an organic light-emitting material as an organic light-emitting layer is a multi-layer structure in which two electrode layers, that is, a cathode and an anode are provided with a light-emitting layer interposed therebetween. In this case, in order to emit light from the light-emitting layer to the outside, a transparent electrode layer is used as one electrode layer (anode). When the light-emitting material and the electrode layers form a laminated structure, the light-emitting material and the material forming the cathode are highly active with oxygen or moisture and accordingly are easily oxidized in air. Therefore, the lighting-emitting layer and the cathode are formed in a vacuum through, for example, a sputtering or vapor deposition process. However, in order to perform, for example, the vapor deposition process in a vacuum, a large apparatus is required and a large amount of time is required to remove the air. For this reason, it is being requested to form the light-emitting layer and the electrode layer under air.

JP-A-11-273859 discloses a light emitting device in which an electrode is made by combining an active metal, such as Li, Mg, or Ca, with a metal, such as Ag, Al, or In, or is made by laminating a layer formed of an active metal, such as Li, Mg, or Ca, and a layer formed of a metal, such as Ag, Al, or In. The electrode is formed by a vacuum deposition method or by sputtering the organic material containing powder of a metal, such as Mg or Ag. It is possible to screen-print or apply an organic material containing the metal powder. However, since the diameter of a particle of the metal powder is large, that is, the particle has a diameter of several microns, the surface of the metal powder is uneven. Further, since the organic material exists between the particles of the metal powder, it is difficult to obtain a layer made of only the metal and to form a dense layer. Since it is difficult to form a dense layer, it is difficult to prevent inflow of oxygen or moisture. Thus, external oxygen or moisture easily reaches the light-emitting layer through the metal layer, resulting in oxidization of the light-emitting layer.

In the light emitting device using an organic light-emitting material, a cathode and an anode are formed with the light-emitting layer interposed therebetween. Electrons from the cathode and holes from the anode are injected into the light-emitting layer and the injected electrons and holes are recombined with each other to emit light. In such an injection-type light emitting device, holes and electrons are externally supplied to HOMO (Highest Occupied Molecular Orbital) and LUMO (Lowest Unoccupied Molecular Orbital) of a light-emitting material. Because a metal or an inorganic semiconductor has more affinity to electrons than many organic materials, in order to inject electrons into the LUMO of the light-emitting material, it is required to form the cathode to have a low work function.

Organic light-emitting materials are broadly classified into two categories, that is, organic low-molecular light-emitting materials, such as an aluminum quinolinol complex, and organic high-molecular light-emitting materials, such as polyphenylenevinylene. In the case of using the low-molecular light-emitting material, a light-emitting layer is formed by the vacuum deposition method, in which the low-molecular light-emitting material is sublimated in a vacuum state and deposited on a glass substrate. In the case of using the high-molecular light-emitting material, since the high-molecular light-emitting material can be melted, a light-emitting layer is formed by a printing technology, such as, a coating method or an inkjet print method. Therefore, it is possible to reduce the fabricating cost and to use not only a glass substrate but also a plastic sheet as the substrate. However, since the cathode layer is easily oxidized, it needs to be formed using a high vacuum by, for example, the sputtering method or the vapor deposition method, and a method of forming a cathode layer at atmospheric pressure has not yet been established. Therefore, even though it is possible to from the organic light-emitting layer under atmospheric pressure by, for example, a printing technique, due to the electrode layers on both sides of the organic light-emitting layer being formed by, for example, the vacuum deposition method or the sputtering method, it is difficult to form the light-emitting layer and the electrode layers under atmospheric pressure all once. Therefore, after the electrode layers are formed in a vacuum, the light-emitting layer is formed under high atmospheric pressure, or the electrode layers are formed by reducing the atmospheric pressure to vacuum pressure, which requires considerable forming time.

Further, since the material used for the cathode easily oxidizes, it is required to seal the light emitting device so as to prevent oxygen or moisture from entering therein. In the past, for example, after electrodes are formed in a high vacuum, a glass substrate is sealed in the high vacuum by using an adhesive which is impermeable to oxygen and moisture. However, since it is difficult to completely shield the light emitting device from oxygen and moisture by such a method, a method of adhering a substrate to a stainless can filled with an absorbent material has been used. JP-A-2001-68264 discloses a gas barrier laminated member forming a metal oxide film using an organosilicon compound. A technique disclosed in JP-A-2001-68264 forms a deposition film of an organosilicon compound by a low-temperature plasma enhanced chemical vapor deposition. The technique is required to be done in a vacuum.

SUMMARY OF THE INVENTION

The present invention has been finalized in view of the drawbacks inherent in the conventional light emitting device, and it is an object of the present invention to provide a light emitting device capable of forming a light-emitting layer and an electrode layer in the air. Another object of the present invention is to provide an electrode having a low work function while exposed to the air in order to improve the light emitting efficiency of a light-emitting layer.

According to an aspect of the invention, a light emitting device includes: a substrate; a lower electrode layer positioned in a light-emitting region having a predetermined size on the substrate; an auxiliary electrode layer formed of a conductive metal over the entire light-emitting region on the lower electrode layer; an organic light-emitting layer provided on the auxiliary electrode layer; and a transparent electrode layer disposed on the organic light-emitting layer. In this light emitting device, the lower electrode layer is formed of a binder resin and a conductive filler, and the asperity of the auxiliary electrode layer is less than the asperity of the lower electrode layer.

According to another aspect of the invention, a light emitting device includes: a substrate; a transparent electrode layer positioned over an entire light-emitting region having a predetermined size on the substrate; an organic light-emitting layer provided on the transparent electrode layer; an auxiliary electrode layer formed of a conductive metal over the entire light-emitting region on the organic light-emitting layer; and a counter electrode layer disposed on the auxiliary electrode layer. In this light emitting device, the counter electrode layer is formed of a binder resin and a conductive filler, and the asperity of the auxiliary electrode layer is less than the asperity of the counter electrode layer.

In the light emitting device according to any of the aspects, preferably, the auxiliary electrode layer is a silver layer. The auxiliary electrode layer may be a silver layer formed of colloidal nano-sized silver particles, and a portion of the silver layer may contain a dispersing agent.

The silver layer may contain at least one of a compound of an alkaline metal, a compound of an alkaline earth metal, an alkaline metal salt, and an alkaline metal earth salt.

It is preferable that the auxiliary electrode layer contain 0.01% to 3.0% by mass of the at least one of the compound of an alkaline metal, the compound of an alkaline earth metal, the alkaline metal salt, and the alkaline metal earth salt with respect to silver.

The silver layer may contain at least one of Li, Na, K, Ca, NaCl, and KCl.

In the light emitting device according to any of the aspects of the invention, the transparent electrode layer may be an organic transparent electrode layer. In this case, a pattern of an inorganic transparent electrode having a resistance lower than that of the organic transparent electrode layer may be provided on the lower surface of the organic transparent electrode layer.

Also, the substrate may be a resin film or a resin substrate.

According to the invention, since the auxiliary electrode layer is formed of a conductive metal interposed between the organic light-emitting layer and the lower electrode layer or the counter electrode layer, it is possible to make the work function of the electrode layer low, to make electron injection energy low, and to improve the light emitting efficiency of the organic light-emitting layer. Further, it is possible to form all of the lower or counter electrode layer and the auxiliary electrode layer under air pressure. Furthermore, since the auxiliary electrode layer has small asperity, it is possible to reduce the thickness of the organic light-emitting layer provided on or underneath the auxiliary electrode layer. As a result, the movement distance of electrons and holes is reduced, which makes it possible to reduce energy loss and to improve the light emitting efficiency.

DESCRIPTION OF THE PREFERRED EMBODIMENT

Figure 1:
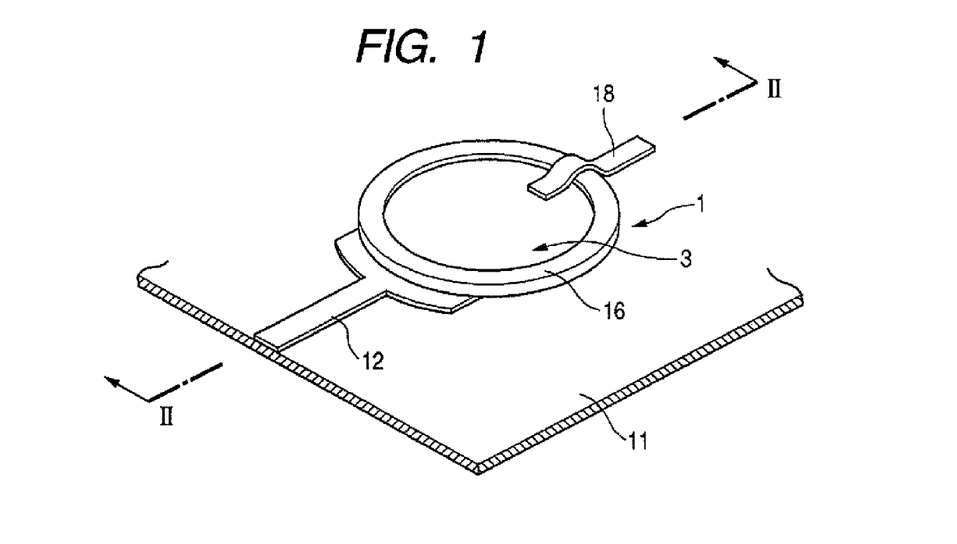
FIG. 1 is a perspective view showing a light emitting device according to an embodiment of the present invention.
Figure 2:
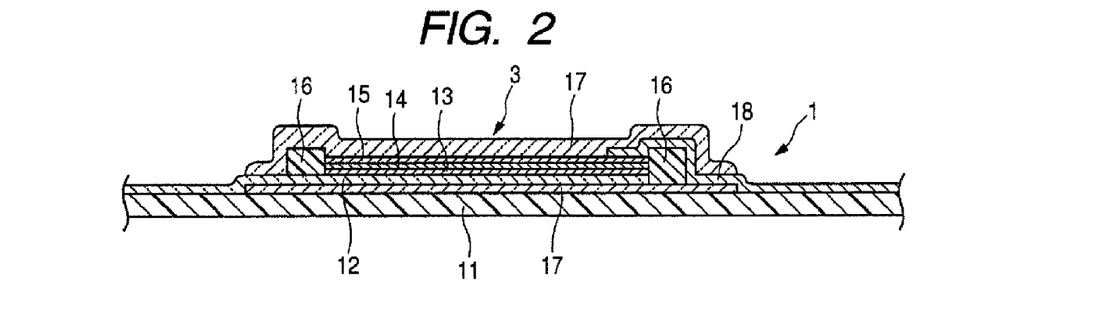
FIG. 2 is a cross-sectional view of a first embodiment of the invention taken along the line II-II of FIG. 1.
Figure 3:
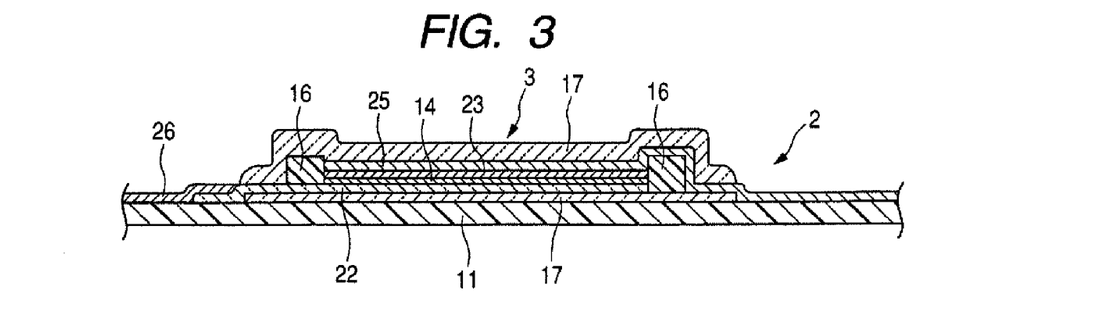
FIG. 3 is a cross-sectional view of a second embodiment of the invention taken along the line II-II of FIG. 1.

FIG. 1 is a perspective view showing a light emitting device 1 having a circular light-emitting region according to an embodiment of the invention. In FIG. 1, a sealing layer 17 is not shown. FIGS. 2 and 3 are cross-sectional views of light emitting devices taken along the line II-II of FIG. 1. More specifically, FIG. 2 shows a top emission type light emitting device according to a first embodiment of the invention in which light is emitted upward. FIG. 3 show a bottom emission type light emitting device according to a second embodiment of the invention in which light is emitted downward.

As shown in FIG. 1, the light emitting device 1 according to the embodiment of the invention includes a circular light-emitting region 3 provided on a substrate 11. In the light emitting device 1, a portion on the substrate 11 is surrounded by a circular bank (sealing wall) 16. Inside the portion, an electrode and a light-emitting layer are laminated and another electrode is formed thereon. A sealing layer 17 seals the electrodes, the light-emitting layer, and the circular bank, as shown in FIGS. 2 and 3. In the light-emitting region 3, the light-emitting layer emits light when the electrodes are electrified and then the light is emitted from the entire light-emitting region 3. The light-emitting region 3 shown in FIG. 1 is circular. However, the shape of the light-emitting region is not limited to a circle, but may be an ellipse, a triangle, a quadrangle such as a rectangle or a square, or a polygon.

The substrate 11 may be a glass substrate, a resin substrate, or a plastic film. Of them, the plastic film is preferably used as the substrate 11 since it has flexibility. Examples of the resin material of the plastic film or the resin substrate include PET (polyethylene terephthalate), PP (polypropylene), PS (polystyrene), acrylate, polyimide, polyaramid, etc. Of them, PET is particularly preferable in the aspects of transparency, flexibility, and heat resistance. The thickness of the substrate 11 is preferably about 100 μm.

On the substrate 11, the bank (sealing wall) 16 is circularly formed by a screen print method. The bank 16 can be made of any insulating material, preferably, resin used for a printing method, and more preferably, a thermosetting resist used for fabricating a semiconductor. The bank 16 may be formed of an opaque material. However, when the bank 16 is made of a transparent material, light emitted from the light-emitting layer, more specifically, light emitted from the light-emitting layer in a horizontal direction travels through the bank 16, causing the amount of light emitted from the light emitting device 1 to increase.

In FIG. 1, the bank 16 is formed by the screen print method. However, the method of fabricating the bank 16 is not limited thereto, but may be a printing/coating method, such as a spin coating method, an inkjet method, a gravure printing method, or a roll coating method. The height of the bank 16 is slightly larger than the portion having the laminated structure therein. In this embodiment, the height of the bank 16 is set in a range of 1 μm to 20 μm. Further, the bank 16 may be formed of a curable resist layer or may be formed by developing and etching processes.

In the first embodiment of the invention shown in FIG. 2, a sealing layer 17 is formed of glass on a surface of the substrate 11, a lower electrode layer 12 is formed thereon, and then the bank 16 is formed thereon so as to define the light-emitting region. The sealing layer 17 will be described below. Subsequently, in the light-emitting region 3, a laminate is formed by stacking electrodes and a light-emitting structure such as a light-emitting layer.

The lower electrode layer 12 is formed by screen-printing using conductive ink containing binder resin and conductive filler. Examples of the binder resin include polyester rein, polyethylene resin, polyurethane resin, etc. Any resin appropriate for printing can be preferably used as the binder resin. Examples of the conductive filler are particles of a metal, such as gold, silver, copper, white gold, aluminum, nickel, indium, yttrium, hafnium, zirconium, magnesium, manganese, vanadium, titan, iron, tungsten, etc. The lower electrode layer 12 is formed of an element having a low work function for injecting electrons. Silver among elements having low work functions is preferably used as the material forming the lower electrode layer.

The lower electrode layer 12 is formed to have a thickness in the range of 1 μm to 50 μm, preferably, 5 μm to 15 μm, and more preferably, 10 μm. The lower electrode layer 12 is formed across the light-emitting region 3.

Since the lower electrode layer 12 is formed of the binder resin and the conductive filler and has gaps therein, a dense auxiliary electrode layer 13 is formed of a conductive metal on the lower electrode layer. The auxiliary electrode layer 13 is formed across the light-emitting region 3. Examples of the conductive metal forming the auxiliary electrode layer 13 include gold, silver, copper, white gold, aluminum, nickel, indium, yttrium, hafnium, zirconium, magnesium, manganese, vanadium, titan, iron, tungsten, etc. A metal having a low work function is preferable as the conductive metal forming the auxiliary electrode layer 13. In this embodiment of the invention, silver is used as the conductive metal.

In this embodiment, the auxiliary electrode layer 13 is formed by coating the lower electrode layer 12 with a dispersion in which colloidal nano-sized silver particles are dispersed in a solvent and drying the solvent at a predetermined temperature. The colloidal nano-sized silver particles are made by coating the surfaces of nano-sized silver particles whose diameters are equal to or less than several tens of nanometers (less than 100 nm), with a protecting colloid for preventing aggregation of the nano-sized silver particles. The protecting colloid, which is a dispersing agent for dispersing the nano-sized silver particles, is preferably a comb-shaped block copolymer. The diameters of the nano-sized silver particles are preferably equal to or less than several tens of nanometers. The average diameter of the nano-sized silver particles is preferably equal to or less than about 20 nm or 10 nm. The solvent, in which the colloidal nano-sized silver particles are dispersed, is preferably water or alcohol, and more preferably, ethanol of alcohol. It doesn't matter if water or alcohol is used as the solvent because the value of the work function of the auxiliary electrode layer 13 is not different. However, in the case of using ethanol, when the heating temperature in the subsequent drying process is set to be less than 100° C., the surface resistance of the auxiliary electrode layer 13 shows a tendency to increase. Meanwhile, in the case of using water, even though the heating temperature in the subsequent drying process is set to a low temperature, the surface resistance of the auxiliary electrode layer 13 does not extremely increase, which makes it possible to perform the drying process even at room temperature.

It is preferable that water or ethanol, which is the solvent, additionally contain a compound made of alkaline metal, a compound made of alkaline earth metal, an alkaline metal salt, or an alkaline earth metal salt. Examples of the alkaline metal compound include lithium, sodium, potassium, rubidium, cesium, etc. Examples of the alkaline earth metal include beryllium, magnesium, calcium, strontium, barium, etc. The alkaline metal and the alkaline earth metal have preferably low work functions, and examples of the alkaline metal and the alkaline earth metal include components or salts of cesium, rubidium, potassium, strontium, barium, sodium, calcium, and lithium. For example, any one of potassium acetate, sodium acetate, calcium acetate, lithium acetate, lithium acetylacetonate, calcium acetylacetonate, sodium chloride (NaCl), potassium chloride (KCl), or a combination thereof can be used as the alkaline metal and the alkaline earth metal.

The additional amount of the compound made of alkaline metal, the compound made of alkaline earth metal, the alkaline metal salt, or the alkaline earth metal salt is preferably 0.01% to 3.0% by weight (by mass) with respect to the weight of silver. Preferably, the compound made of alkaline metal, the compound made of alkaline earth metal, the alkaline metal salt, or the alkaline earth metal salt is potassium acetate. The concentration of potassium acetate is preferably 0.01% to 3.0% with respect to the weight (mass) of silver, and more preferably, 0.1% to 1.0% with respect to the weight (mass) of silver.

When the auxiliary electrode layer 13 is formed, the dispersion is prepared to have a silver content of 10% to 50% by weight which disperses the colloidal nano-sized silver particles in the solvent and is applied on the lower electrode layer 12. More preferably, the silver content is set to 30% by weight. When the dispersion is prepared to have a silver content of 30% by weight, the content of the dispersing agent, which is a protecting colloid, becomes 2% by weight.

The prepared dispersion is dispersed onto the lower electrode layer 12 by a dispenser, more preferably, a tubing dispenser so as to form an even auxiliary electrode layer. Since the tubing dispenser is capable of nonpulsatile dispensing of a very small amount unlike a nonpulsatile air system dispenser, it is more preferably used. The thickness of the auxiliary electrode layer 13 before drying is about 40 μm. After performing drying at a predetermined temperature, the auxiliary electrode layer 13 becomes an even layer having a thickness of about 1 μm.

The heating temperature when the auxiliary electrode layer 13 is dried is preferably in the range of room temperature to 200° C. When the heating temperature is higher than 200° C., in the case of using a resin film or a resin substrate as the substrate 11, deformation easily occurs. When the heating temperature is low than the room temperature, the drying time becomes longer, resulting in an excessive forming time.

The auxiliary electrode layer 13 after drying is an even dense layer in which the nano-sized silver particles are combined. The asperity of the auxiliary electrode layer 13 is less than the asperity of the lower electrode layer. In a state in which the dispersion of the nano-sized silver particles is applied on the lower electrode layer, the colloidal nano-sized silver particles made by coating the surfaces of the nano-sized silver particles with the protecting colloid are dispersed in the solvent. Then, when the solvent and the protecting colloid are removed by heating, the nano-sized silver particles remain. When a metallic material, such as silver, is divided into particles having a size of several nanometers, that is, nano-sized particles, the reactivity considerably increases, and thus the particles can combine with one another even at room temperature. Therefore, the nano-sized silver particles obtained by removing the protecting colloid are combined with the solvent combine to form a very dense and even layer. In some portions of the silver layer, a portion of the dispersing agent that has not been dissolved by the heating remains. However, the concentration of the dispersing agent is very low, and thus it is negligible. Therefore, the remaining dispersing agent does not affect the work function of the auxiliary electrode layer 13.

After forming the lower electrode layer 12 using silver as the conductive filler and then forming the auxiliary electrode layer 13 using the colloidal nano-sized silver particles, the work function of the entire electrode including the lower electrode layer 12 and the auxiliary electrode layer 13 is measured under atmosphere. The work function (reference value) of silver under atmosphere is 4.67 eV. However, since the work function of the electrode including the auxiliary electrode layer 13 is in a range of 4.21 eV to 4.69 eV, the electrode can be preferably used as an electron injection layer. When the component made of alkaline metal, the component made of alkaline earth metal, the alkaline metal salt, or the alkaline earth metal salt is added to the auxiliary electrode layer, the work function of the electrode is in a range of 4.21 eV to 4.49 eV. Therefore, the electrode can be preferably used as an electron injection layer.

A light-emitting layer 14 is formed on the auxiliary electrode layer 13. The light-emitting layer 14 is formed by dissolving an organic light-emitting material in an organic solvent, such as dichloroethane, to prepare the solution, and the solution is applied by using an inkjet method or a dispenser, more preferably, a tubing dispenser on the auxiliary electrode layer 13. In order to reduce the movement distance of electrons and holes, the light-emitting layer 14 is preferably made thin as possible. However, if the light-emitting layer 14 is excessively thin, due to the unevenness of the lower electrode layer 12 and the auxiliary electrode layer 13, a short-circuit can easily occur. In this embodiment, the thickness of the light-emitting layer 14 is preferably in a range of 100 nm to 200 nm.

Organic EL (electro-luminescent) materials emitting light by an external electrical field are preferably used as the organic light-emitting material. Since the organic light-emitting material should be dissolved in a solvent in order to be applied to a printing method, high-molecular light-emitting materials are preferably used as the organic light-emitting material. Alternatively, low-molecular light-emitting materials and mixtures of low-molecular light-emitting materials and high-molecular light-emitting materials are usable. For example, it is possible to use a mixture of polyvinyl carbazole (PVK) (a high-molecular hole transporting material), 2,5-bis(1-naphthyl)-1,3,4-oxadiazole (BND)(a low-molecular electron transporting material), and 3-(2'-benzothiazolyl)-7-(diethylamino)-coumarin (coumarin-6) (a low-molecular light-emitting material). The structures of PVK, BND, and a coumarin-6 are shown in Formulas 1 to 3, respectively. After applying the light-emitting material, it is preferable to perform a drying process under dry air.

PVK [Formula 1]

BND [Formula 2]

Coumarin-6 [Formula 3]

A transparent electrode layer 15 transmitting light emitted from the light-emitting layer 14 is formed on the light-emitting layer 14. The transparent electrode layer 15 is formed of a transparent conductive high-molecular material by wet coating. The transparent electrode layer 15 is preferably formed of an organic material. The light-emitting layer 14 is coated with a solution of the transparent conductive high-molecular material by using an ink-jet method or a dispenser, preferably, a tubing dispenser. A doping agent may be added to the transparent conductive high-molecular material. After coating the light-emitting layer 14 with the solution of the transparent conductive high-molecular material or a solution of the transparent conductive high-molecular material containing the doping agent, the drying process is performed under dry air. As a result, the transparent electrode layer 15 is formed. The thickness of the transparent electrode layer 15 is preferably in a range of 100 nm to 700 nm. If the thickness of the transparent electrode layer 15 is less than 100 nm, a voltage applied to the light-emitting layer 14 becomes insufficient, which is undesirable. Meanwhile, if the thickness of the transparent electrode layer 15 is more than 700 nm, the light emitting efficiency of the light-emitting layer is reduced, which is undesirable. More preferably, the thickness of the transparent electrode layer 15 is in a range of 200 nm to 500 nm.

The transparent conductive high-molecular material is preferably poly-3,4-ethylene dioxythiophene (PEDOT), but is not limited thereto. In the case of using PEDOT as the transparent conductive high-molecular material, it is preferable to add polyphenylene sulfide (PPS) as the doping agent. The structure of PEDOT and PPS are shown in Formulas 4 and 5, respectively.

PEDOT [Formula 4]

PPS [Formula 5]

After the transparent electrode layer 15 is formed, a lead electrode 18 is formed thereon. The lead electrode 18 is formed with the same kinds of binder resin and conductive filler as those of the lower electrode layer 12 by, for example, the screen print method. In order to prevent the lead electrode 18 from reducing the area of a light transmitting region of the transparent electrode layer 1, the lead electrode 18 is formed to overlap only a portion of the transparent electrode layer and to extend to the outside of the light-emitting region 3.

After a laminated structure of the lower electrode layer 12, the auxiliary electrode layer 13, the light-emitting layer 14, the transparent electrode layer 15, and the lead electrode 18 is formed, the laminated structure is sealed with a sealing layer 17. The sealing layer 17 for sealing the laminated structure is formed of glass produced by a sol-gel method using a metal alkoxide.

Metal alkoxide is a compound having at least one M-O—C bond (wherein M is a metal), and a metal alkoxide, such as aluminum, barium, boron, bismuth, calcium, iron, gallium, germanium, hafnium, indium, potassium, lanthanum, lithium, magnesium, molybdenum, sodium, niobium, lead, phosphorus, antimony, silicon, tin, strontium, tantalum, titanium, vanadium, tungsten, yttrium, zinc, and zirconium is preferably used as the metal. Among them, silica glass is provided by means of a sol-gel method, and a metal alkoxide of silicon (silicon alkoxide) is preferable.

Any of the following materials can be used as the silicon alkoxide: tetramethoxysilane, tetraethoxysilane, fluoroalkyl-i-propoxysilane, methyltrimethoxysilane, methyl triethoxysilane, dimethyldiethoxysilane, phenyltriethoxysilane, hexamethyl disilazane, hexyltrimethoxysilane, and decyltrimethoxysilane. Particularly, triethoxysilane, trimethoxysilane, fluoroalkyl, or i-propoxy silane is preferably used.

Among silicon alkoxides, a silane coupling agent having two kinds of functional groups with different reactivities in one molecule can be used. Examples of the silane coupling agent include vinyl trichlorosilane, vinyl trimethoxysilane, vinyl triethoxysilane, 2-(3,4-epoxycyclohexyl)ethyl trimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropylmethyltrimethoxysilane, 3-methacryloxypropylmethyldiethoxysilane, 3-methacryloxypropylmethyltriethoxysilane, 3-acryloxypropylmethyltrimethoxysilane, 3-aminopropylmethyldimethoxysilane, N-2(amino ethyl)3-aminopropylmethyldimethoxysilane, N-2(amino ethyl)3-aminopropyltrimethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, hydrochloride of N-(vinylbenzyl)-2-aminoethyl-3-aminopropyltrimethoxysilane, and aminosilane. Particularly, an epoxy group containing one such as glycidoxypropyltrimethoxysilane and glycidoxypropyltriethoxysilane is preferably used.

For example, in the case in which tetraethoxysilane (TEOS) is used as a metal alkoxide, TEOS, ethanol, and water are mixed, and the mixture—as it is—is subject to the reaction as shown in the chemical formula 6 to hydrolyze TEOS, thus forming silanol. Further, as for the silanol, a transparent gel of silica is obtained by a dehydration condensation reaction. From the obtained gel, ethanol and water are evaporated, and heat treatment is performed at a temperature of 120° C. to 150° C. to obtain glass. The obtained glass is a silica glass, which is excellent in transparency. Therefore, even though the obtained glass is used to form the sealing layer 17, it does not prevent light from being emitted from the light-emitting layer 14 to the outside. Further, since the glass has gas harrier properties so as not to transmit oxygen or moisture, it is possible to prevent permeation of oxygen or moisture to the inside of the sealing layer.

(TEOS)

(SILANOL)

(GLASS) [Formula 6]

In the case of using TEOS to perform sealing, after the laminated structure of the lower electrode layer 12, the auxiliary electrode layer 13, the light-emitting layer 14, the transparent electrode layer 15, and the lead electrode 18 is formed, as shown in FIG. 2, a solution of TEOS is applied by using a dispenser, more preferably, a tubing dispenser so as to cover the whole laminated structure. A solution containing 1% by weight of acetic acid or sulfuric acid is used as the solution of TEOS. After application, heating is performed at a temperature of 100° C. to 200° C., more preferably, 120° C. to 170° C. In this way, glass is produced. More preferably, first of all, the sealing layer 17 is formed of glass on the substrate 11 using a solution of TEOS, as described above. The lower electrode layer 12 and a bank 16 are formed on the formed sealing layer 17. Then, the auxiliary electrode layer 13, the light-emitting layer 14, the transparent electrode layer 15, and the lead electrode 18 are sequentially formed. When the solution of TEOS is applied to the entire laminated structure to form the sealing layer 17, it is possible to seal the entire laminated structure, as shown in FIG. 2, and thus a sealing characteristic is improved. In particular, when a plastic film or a resin substrate is used as the substrate 11, the plastic film or the resin substrate transmits oxygen or moisture. In this case, when the sealing layer 17 is provided on the substrate 11 as described above, it is possible to prevent permeation of gas from the plastic film or the resin substrate to the inside of the sealing layer 17.

FIG. 3 shows a second embodiment of the invention. FIG. 3 shows the bottom emission type of a light emitting device in which the order of an electrode layer and a transparent electrode layer is reverse to the order of the electrode layer and the transparent electrode layer of the top emission type of the light emitting device shown in FIG. 2. In FIG. 3, light is emitted downward.

A sealing layer 17 made of glass is formed on a substrate 11, a transparent electrode layer 22 is formed thereon, and then a bank (sealing wall) 16 is formed to define a light-emitting region 3. On a portion of the transparent electrode layer 22 outside the bank 16, a lead wiring line 26 is formed by screen printing using conductive ink containing binder resin and a silver filler.

The transparent electrode layer may be an organic transparent electrode layer formed of a conductive high-molecular material by wet coating. In the case of using an organic transparent electrode layer as the transparent electrode, it is preferable to provide a pattern of an inorganic transparent electrode, having a resistance lower than that of the organic transparent electrode layer, on the lower surface of the organic transparent electrode layer. The material of the inorganic transparent electrode is preferably indium tin oxide (ITO).

In the light-emitting region 3, the transparent electrode layer 22, serving as a lower electrode layer, is formed on the surface of the sealing layer 17, and a light-emitting layer 14 is formed on the transparent electrode layer 22. Then, an auxiliary electrode layer 23 is formed on the light-emitting layer 14, and a counter electrode layer 25, serving as an upper electrode layer, is formed on the auxiliary layer 25. The substrate 11, the bank 16, the light-emitting layer 14, and the auxiliary electrode layer 23 may be formed of the same materials as those in the first embodiment shown in FIG. 2. Also, the transparent electrode layer 22 may be formed of the same material as the transparent electrode layer 15 shown in FIG. 2, and the counter electrode layer 25 may be formed of the same material as the low electrode layer 12 and the lead electrode 18 shown in FIG. 2. Preferably, the counter electrode layer 25 is preferably formed over the entire upper surface of the auxiliary electrode layer 23. However, the counter electrode layer 25 may be laminated to overlap only a portion of the upper surface of the auxiliary electrode layer 23. As in the first embodiment shown in FIG. 2, the asperity of the auxiliary electrode layer 23 is less than the asperity of the counter electrode layer 25, and the work function of the auxiliary electrode layer 23 is also less than the work function of the counter electrode layer 25.

The sealing layer 17 is formed of glass produced by a sol-gel method using a metal alkoxide, as described above with reference to FIG. 2. Silicon alkoxide and tetramethoxysilane are preferably used as the metal alkoxide. The method of forming the sealing layer 17 is the same as that in the first embodiment shown in FIG. 2. Similar to the first embodiment shown in FIG. 2, preferably, first of all, the sealing layer 17 is formed of glass on the substrate 11.

Hereinafter, examples of the invention will be described, but the invention is not limited thereto.

EXAMPLE 1

A solution of tetraethoxysilane is applied on a PET film (Lumirror U94 made by Toray industries, Inc.) to have a thickness of 100 μm by a tubing dispenser (made by Musashi engineering, Inc.), and a heating process is performed at a temperature of 120° C. for half an hour, thereby forming the sealing layer 17 of glass. The tetraethoxysilane solution contains 1% by mass of acetic acid.

As shown in FIG. 1, screen printing is performed on SW1300 (made by Asahi Chemical Research Laboratory Co., Ltd.), in which a polyester resin binder and silver particles are contained in a circular region, by using a 400-mesh stainless screen printing plate. Then, a heating process is performed under dry air at a temperature of 110° C. for half an hour. In this way, the lower electrode layer 12 is formed.

Subsequently, the bank (sealing wall) 16 for defining a circular light-emitting region 3 (having a diameter of 5 mm to 10 mm) is formed by screen printing. The bank 16 is formed of FR-1TD5-S, made by Asahi Chemical Research Laboratory Co., Ltd., as a thermosetting transparent resist for a flexible circuit, by using a 200-mesh stainless screen printing plate. After the bank is formed, a heating process is performed under dry air at a temperature of 110° C. for half an hour.

Next, colloidal nano silver ink is dropped onto the lower electrode layer 12 by using a tubing dispenser, and a heating process is performed under dry air at a temperature of 110° C. for half an hour, thereby forming the auxiliary electrode layer 13. The colloidal nano silver ink is prepared by adding potassium acetate to Fine Sphere SVE102 made by Nippon Paint Co., Ltd. such that the content of the potassium acetate becomes 0.5% by mass with respect to the weight of silver. The average diameter of the silver particles is about 10 nm, and a solvent of the colloidal nano silver ink is ethanol.

Subsequently, an organic light-emitting material is dropped onto the auxiliary electrode layer 13 by a tubing dispenser, and a heating process is performed under dry air at a temperature of 110° C. for half an hour, thereby forming the organic light-emitting layer 14. A solution produced by mixing PVK (polyvinyl carbazole), BND (2,5-bis(1-naphthyl)-1, 3,4-oxadiazole), and coumarin-6 (3-(2'-Benzothiazolyl)-7-(diethylamino)-coumarin) at a weight ratio of 160:40:1 and dissolving the mixture in dichloroethane is used as the organic light-emitting material. PVK, BND, and coumarin-6 serve as a hole transport material, an electron transport material, and a light-emitting material, respectively.

A transparent electrode layer 15 made of a transparent conductive high-molecular material is formed on the light-emitting layer 14. Orgacon® S-300, which is made by Agfa-Gevaert Japan, Ltd. and is a transparent conductive coating solution of PEDOT (poly-3,4-ethylene dioxythiophene)/PPS (polyphenylene sulfide), is dropped onto the light-emitting layer 14 by a tubing dispenser and a heating process is performed under dry air at a temperature of 110° C. for half an hour. In this way, the transparent electrode layer 15 is formed.

Then, the light-emitting region and the bank are coated with the solution of TEOS and a heating process is performed under dry air at a temperature of 120° C. for half an hour, thereby forming the sealing layer 17 of glass.

When a voltage of 20 V is applied to the transparent electrode 15 (anode), serving as an upper electrode, and the lower electrode layer 12 (cathode) of the dot emission type of the light emitting device obtained by the above-mentioned processes, green light with a brightness of 20 cd(candelas)/m$^2$ is emitted. The half-life of the brightness is one week.

In a state in which the auxiliary electrode layer 13 is formed on the lower electrode layer 12, when the work function and surface resistance of the auxiliary electrode layer 13 are measured in the air with a photoelectron spectrometer AC-2 made by Riken Keiki Co., Ltd., 4.21 eV and 5.8 Ω/SQ are obtained, respectively. Also, the work function and surface resistance are measured while changing the drying temperature after the colloidal nano silver ink (solvent: ethanol) drops. The measurement results are shown in the following Table 1 together with the measurement results in the case of using colloidal nano silver ink (solvent: ethanol) without potassium acetate. Here, the drying time periods are all half an hour.

TABLE 1

| Drying temperature | Colloidal nano silver ink (solvent: ethanol) + potassium acetate 0.5% (mass ratio with respect to silver) | | Only colloidal nano silver ink (solvent: ethanol) | |
|---|---|---|---|---|
| | Surface resistance (Ω/SQ) | Work function (eV) | Surface resistance (Ω/SQ) | Work function (eV) |
| 200° C. | 0.38 | 4.35 | 0.29 | 4.68 |
| 170° C. | 1.28 | 4.91 | 1.0 | 4.67 |
| 120° C. | — | — | 4.0 | 4.62 |
| 110° C. | 5.3 | 4.21 | 4.0 | 4.62 |
| 100° C. | 158 | 4.25 | 72.7 | 4.63 |

Also, in a state in which the auxiliary electrode layer 13 is formed on the lower electrode layer 12, the work function and surface resistance of the auxiliary electrode layer 13 are measured while changing the content of potassium acetate in the colloidal nano silver ink (solvent: ethanol). The measurement results are shown in the following Table 2. The content of potassium acetate is expressed as % by mass with respect to the weight (mass) of silver. The drying processes after the ink drops are all performed in the air at a temperature of 110° C. for half an hour.

TABLE 2

| Content of potassium acetate (mass ratio of silver) (%) | Surface resistance (Ω/SQ) | Work function (eV) |
|---|---|---|
| 0.1 | 2.9 | 4.43 |
| 0.3 | 4.3 | 4.23 |
| 0.5 | 5.8 | 4.21 |
| 0.6 | 54.5 | 4.28 |
| 1.0 | 350 | 4.38 |

When various metal compounds or metal salts are added to the colloidal nano silver ink (solvent: ethanol), the work function of the auxiliary electrode layer 13 formed on the lower electrode layer 12 is measured. The measurement results are shown in the following Table 3. The content of the metal compounds or the metal salts is 0.5% by mass with respect to the weight (mass) of silver, and the drying process after the ink drops is performed under air at a temperature of 110° C. for half an hour.

TABLE 3

| Metal compound | Work function (eV) |
|---|---|
| $CH_3COOLi$ | 4.39 |
| $CH_3COONa$ | 4.33 |
| $CH_3COOK$ | 4.21 |
| $CH_3COOCa$ | 4.48 |
| AcetylacetonadoLi | 4.44 |
| AcetylacetonadoCa | 4.49 |
| NaCl | 4.30 |
| KCl | 4.25 |

EXAMPLE 2

Using the same materials as Example 1, the bottom emission type light emitting device shown in FIG. 3 is fabricated. When a voltage of 20 V is applied to the transparent electrode layer 22 (anode), serving as a lower electrode layer, and the counter electrode layer 25 (cathode), serving as an upper electrode layer, green light with a brightness of 15 cd(candelas)/m$^2$ is emitted. The half-life of the brightness is 4 days.

EXAMPLE 3

The light emitting device as shown in FIG. 2 is fabricated in the same manner as Example 1 except that Fine Sphere SVE102 made by Nippon Paint Co., Ltd. is used as the colloidal nano silver ink without adding potassium acetate thereto. When a voltage of 20 V is applied to the upper transparent electrode layer (anode) and the lower electrode layer (cathode), green light with a brightness of 20 cd(candelas)/m$^2$ is emitted. The half-life of the brightness is 3 days.

EXAMPLE 4

The light emitting device as shown in FIG. 2 is fabricated in the same manner as Example 1 except that, instead of Fine Sphere SVE102 (solvent: ethanol) made by Nippon Paint Co., Ltd., Fine Sphere SVE102 (solvent: water) made by Nippon Paint Co., Ltd. is used as the colloidal nano silver ink. When a voltage of 20 V is applied to the transparent electrode layer 15 (anode), serving as an upper electrode layer, and the lower electrode layer 12 (cathode), green light with a brightness of 20 cd(candelas)/m$^2$ is emitted. The half-life of the brightness is one week.

In a state in which the auxiliary electrode layer 13 is formed on the lower electrode layer 12, when the work function and surface resistance of the auxiliary electrode layer 13 are measured in the air, 4.28 eV and 0.72 Ω/SQ are obtained, respectively. Also, the work function and surface resistance are measured while changing the drying temperature after the colloidal nano silver ink (solvent: water) drops. The measurement results are shown in the following Table 4 together with the measurement results in the case of using colloidal nano silver ink (solvent: water) without potassium acetate. Here, the drying time periods are all half an hour.

TABLE 4

| Drying temperature | Colloidal nano silver ink (solvent: water) + potassium acetate 0.5% (mass ratio with respect to silver) | | Only colloidal nano silver ink (solvent: water) | |
|---|---|---|---|---|
| | Surface resistance (Ω/SQ) | Work function (eV) | Surface resistance (Ω/SQ) | Work function (eV) |
| 200° C. | 0.45 | 4.37 | 0.22 | 4.68 |
| 110° C. | 0.72 | 4.28 | 0.76 | 4.68 |
| 100° C. | 1.8 | 4.36 | 1.3 | 4.65 |
| 90° C. | 2.5 | 4.38 | 1.0 | 4.68 |
| 50° C. | 5.8 | 4.35 | 2.3 | 4.66 |
| 40° C. | 4.8 | 4.38 | 5.3 | 4.69 |

EXAMPLE 5

The top emission type light emitting device as shown in FIG. 2 is fabricated in the same manner as Example 1 except that the sealing of the substrate and the sealing of the light-emitting region or the bank (sealing wall) using the solution of TEOS is not performed. When a voltage of 20 V is applied to the transparent electrode layer 15 (anode), serving as an upper electrode layer, and the lower electrode layer 12 (cathode), green light with a brightness of 20 cd(candelas)/m$^2$ is emitted. However, when one day elapses, the brightness is reduced to 5 cd(candelas)/m$^2$, which is less than the initial brightness. Therefore, the half-life of the brightness is less than one day.

TABLE 5

| | Brightness (cd/m$^2$) | Half-life of brightness (Days) | Top emission type/bottom emission type | Colloidal nano silver ink | | Sealed or Non-sealed |
|---|---|---|---|---|---|---|
| | | | | Solvent | Content of potassium acetate (% by weight) | |
| Example 1 | 20 | 7 | Top emission type | Ethanol | 0.5 | Sealed |
| Example 2 | 15 | 4 | Bottom emission type | Ethanol | 0.5 | Sealed |
| Example 3 | 10 | 3 | Top emission type | Ethanol | 0 | Sealed |
| Example 4 | 20 | 7 | Top emission type | Water | 0.5 | Sealed |
| Example 5 | 20 | <1 | Top emission type | Ethanol | 0.5 | Non sealed |

From those results, any of the top and bottom emission type light emitting devices according to the embodiments of the invention emits light with high brightness. Further, the sealing by glass using metal alkoxide improves the sealing characteristic. Furthermore, since the auxiliary electrode layer contains an alkaline metal or an alkaline earth metal, the work function of the layer, serving as a cathode, is low and light with high brightness is emitted.

The invention provides a light emitting device using an organic light-emitting material, which can be applied to, for example, a display, particularly, a plasma display panel as a surface emitting illuminator.

The invention claimed is:
1. A light emitting device comprising:
a substrate;
a lower electrode layer positioned in a light-emitting region having a predetermined size on the substrate;

an auxiliary electrode layer formed of silver over the entire light-emitting region on the lower electrode layer;

an organic light-emitting layer provided on the auxiliary electrode layer; and a transparent electrode layer disposed on the organic light-emitting layer, wherein the lower electrode layer is formed of a binder resin and a conductive filler, and the asperity of the auxiliary electrode layer is less than the asperity of the lower electrode layer.

2. The light emitting device according to claim 1, wherein the auxiliary electrode layer is a silver layer formed of colloidal nano-sized silver particles, and a portion of the silver layer contains a dispersing agent.

3. The light emitting device according to claim 1, wherein the silver layer contains at least one of a compound of an alkaline metal, a compound of an alkaline earth metal, an alkaline metal salt, and an alkaline metal earth salt.

4. The light emitting device according to claim 1, wherein the auxiliary electrode layer contains 0.01% to 3.0% by mass of the at least one of the compound of an alkaline metal, the compound of an alkaline earth metal, the alkaline metal salt, and the alkaline metal earth salt with respect to silver.

5. The light emitting device according to claim 3, wherein the silver layer contains at least one of Li, Na, K, Ca, NaCl, and KCl.

6. The light emitting device according to claim 1, wherein the transparent electrode layer is an organic transparent electrode layer.

7. The light emitting device according to claim 6, wherein a pattern of an inorganic transparent electrode having a resistance lower than that of the organic transparent electrode layer is provided on the lower surface of the organic transparent electrode layer.

8. The light emitting device according to claim 1, wherein the substrate is a resin film or a resin substrate.

9. The light emitting device according to claim 1, wherein the light-emitting region is surrounded by a bank.

10. A light emitting device comprising:

a substrate;

a transparent electrode layer positioned over an entire light-emitting region having a predetermined size on the substrate;

an organic light-emitting layer provided on the transparent electrode layer; an auxiliary electrode layer formed of a conductive metal over the entire light-emitting region on the organic light-emitting layer; and a counter electrode layer disposed on the auxiliary electrode layer, wherein the counter electrode layer is formed of a binder resin and a conductive filler, the asperity of the auxiliary electrode layer is less than the asperity of the counter electrode layer, and the auxiliary electrode layer is a silver layer.

11. The light emitting device according to claim 10, wherein the auxiliary electrode layer is a silver layer formed of colloidal nano-sized silver particles, and a portion of the silver layer contains a dispersing agent.

12. The light emitting device according to claim 10, wherein the silver layer contains at least one of a compound of an alkaline metal, a compound of an alkaline earth metal, an alkaline metal salt, and an alkaline metal earth salt.

13. The light emitting device according to claim 10, wherein the auxiliary electrode layer contains 0.01% to 3.0% by mass of the at least one of the compound of an alkaline metal, the compound of an alkaline earth metal, the alkaline metal salt, and the alkaline metal earth salt with respect to silver.

14. The light emitting device according to claim 12, wherein the silver layer contains at least one of Li, Na, K, Ca, NaCl, and KCl.

15. The light emitting device according to claim 10, wherein the transparent electrode layer is an organic transparent electrode layer.

16. The light emitting device according to claim 15, wherein a pattern of an inorganic transparent electrode having a resistance lower than that of the organic transparent electrode layer is provided on the lower surface of the organic transparent electrode layer.

17. The light emitting device according to claim 10, wherein the substrate is a resin film or a resin substrate.

18. The light emitting device according to claim 10, wherein the light-emitting region is surrounded by a bank.

* * * * *

UNITED STATES PATENT AND TRADEMARK OFFICE
CERTIFICATE OF CORRECTION

PATENT NO. : 7,633,082 B2  Page 1 of 1
APPLICATION NO. : 11/565428
DATED : December 15, 2009
INVENTOR(S) : Yoshiyuki Asabe It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 469 days.

Signed and Sealed this

Second Day of November, 2010

David J. Kappos
*Director of the United States Patent and Trademark Office*